(12) United States Patent
Sun et al.

(10) Patent No.: US 8,916,021 B2
(45) Date of Patent: Dec. 23, 2014

(54) ELECTROSTATIC CHUCK AND SHOWERHEAD WITH ENHANCED THERMAL PROPERTIES AND METHODS OF MAKING THEREOF

(75) Inventors: Jennifer Sun, Mountain View, CA (US); Sumanth Banda, San Jose, CA (US); Ren-Guan Duan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 124 days.

(21) Appl. No.: 13/276,524

(22) Filed: Oct. 19, 2011

(65) Prior Publication Data

US 2012/0104703 A1 May 3, 2012

Related U.S. Application Data

(60) Provisional application No. 61/407,213, filed on Oct. 27, 2010.

(51) Int. Cl.
*B23B 31/02* (2006.01)
*B32B 15/08* (2006.01)
*H01L 21/683* (2006.01)
*C04B 35/626* (2006.01)
*C04B 35/634* (2006.01)
*C04B 37/00* (2006.01)
*C04B 37/02* (2006.01)

(52) U.S. Cl.
CPC ............ *H01L 21/6831* (2013.01); *B23B 31/02* (2013.01); *B32B 15/08* (2013.01); *C04B 35/6269* (2013.01); *C04B 35/63424* (2013.01); *C04B 37/005* (2013.01); *C04B 37/006* (2013.01); *C04B 37/008* (2013.01); *C04B 37/025* (2013.01); *C04B 37/026* (2013.01); *C04B 37/028* (2013.01); *C04B 2235/604* (2013.01); *C04B 2237/064* (2013.01); *C04B 2237/08* (2013.01); *C04B 2237/12* (2013.01); *C04B 2237/34* (2013.01); *C04B 2237/343* (2013.01); *C04B 2237/365* (2013.01); *C04B 2237/366* (2013.01); *C04B 2237/402* (2013.01); *C04B 2237/55* (2013.01); *C04B 2237/62* (2013.01)
USPC .............. 156/327; 156/60; 156/329; 279/128

(58) Field of Classification Search
USPC ............................ 156/60, 327, 329; 279/128
See application file for complete search history.

(56) References Cited

U.S. PATENT DOCUMENTS 6,721,162 B2 4/2004 Weldon et al.
7,672,110 B2 3/2010 Sun et al.
2012/0028057 A1* 2/2012 Aihara et al. ................. 428/457

FOREIGN PATENT DOCUMENTS

WO WO2010095720 * 8/2010 .............. B32B 15/04

* cited by examiner

*Primary Examiner* — Michael Orlando
(74) *Attorney, Agent, or Firm* — Patterson & Sheridan, LLP

(57) ABSTRACT

Embodiments of the present invention generally provide chamber components with enhanced thermal properties and methods of enhancing thermal properties of chamber components including bonding materials. One embodiment of the present invention provides a method for fabricating a composite structure. The method includes applying a bonding material to a first component, and converting the bonding material applied to the first component to an enhanced bonding layer by heating the bonding material to outgas volatile species from the bonding material. The outgassed volatile species accumulates to at least 0.05% in mass of the bonding material. The method further includes contacting a second component and the enhanced bonding layer to join the first and second components.

18 Claims, 7 Drawing Sheets

US 8,916,021 B2

ELECTROSTATIC CHUCK AND SHOWERHEAD WITH ENHANCED THERMAL PROPERTIES AND METHODS OF MAKING THEREOF

CROSS REFERENCE TO RELATED APPLICATIONS

This application claims priority to U.S. Provisional Patent Application Ser. No. 61/407,213, filed Oct. 27, 2010, which is incorporated herein by reference.

BACKGROUND

1. Field of the Invention

Embodiments of the present invention relate to methods for enhancing thermal stability of composite structures joined by bonding materials. Particularly, embodiments of the present invention relate to methods for fabricating chamber parts, such as an ESC or a showerhead, by baking a bonding material prior to bonding two or more components together.

2. Description of the Related Art

Semiconductor processing chambers often include parts that are formed by bonding two or more components together with bonding materials to achieve desired properties. For example, electrostatic chucks, used for supporting and securing substrates during processing, usually include a dielectric puck bonded to a metallic base by a thermal conductive bonding material. Showerheads for distributing processing gases to a plasma processing chamber may include a conductive plate bonded to a ceramic plate by a bonding material. The bonding materials provide secured connection between different components while providing thermal conductivity and/or electrical insulation. However, the bonding materials can have negative impact on processing, especially when the processes are performed at elevated temperatures.

Embodiments of the present invention provide chamber components with enhanced thermal properties and methods for enhancing thermal properties of chamber components joined by bonding materials.

SUMMARY

Embodiments of the present invention relate to methods for enhancing thermal stability of composite structures joined by bonding materials. Embodiments of the present invention generally provide chamber components with enhanced thermal properties and methods of enhancing thermal properties of chamber components joined by bonding materials.

One embodiment of the present invention provides a method for fabricating a composite structure. The method includes applying a bonding material to a first component, and converting the bonding material applied to the first component to an enhanced bonding layer by heating the bonding material to outgas volatile species from the bonding material. The outgassed volatile species accumulates to at least 0.05% in mass of the bonding material. The method further includes contacting a second component and the enhanced bonding layer to join the first and second components.

Another embodiment of the present invention provides a method for forming a structure for a semiconductor processing chamber. The method includes applying a bonding material to a first component of the structure, and converting to the bonding material applied to the first component to an enhanced bonding layer by baking the bonding material and the first component while the bonding material is exposed. The enhanced bonding layer has at least 0.05% volatile material than the bonding material. The method further includes pressing a second component against the enhanced bonding layer to join the first and second components.

Yet another embodiment of the present invention provides a chamber structure. The chamber structure includes a first component fabricated from a first material, a second component fabricated from a second material, and an enhanced bonding layer joining the first and second components. The enhanced bonding layer is converted from a bonding material by heating the bonding material after applying the bonding material to the first component and prior to joining the second component with the first component. The enhanced bonding layer has at least about 0.05% less volatile species than the bonding material from which the enhanced bonding layer is converted.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention relate to methods for enhancing thermal stability of composite structures joined by bonding materials. Particularly, embodiments of the present invention provide chamber parts with enhanced thermal properties and methods for making chamber parts joined by bonding materials with enhanced thermal properties, particularly, enhanced thermal stability. One embodiment of the present invention provides a method for obtaining a bonding layer for joining first and second components with enhanced thermal stability by baking a bonding material. In one embodiment, baking can be performed after applying the bonding material on the first component and before joining the first component with the second component. In one embodiment, the baking process is performed at a temperature higher than the intended operating temperature of the chamber parts. The baking process changes the composition and properties of the bonding material, and results in an enhanced bonding layer.

Embodiments of the present invention may be used in manufacturing of any structures having two or more components joined by a bonding material. Particularly, embodiments of the present invention can be applied to any parts of a semiconductor processing chamber that requires bonding material. For example and not by embodiments of the present invention may be used to forming ESCs and showerheads used in semiconductor processing chambers.

Figure 1:
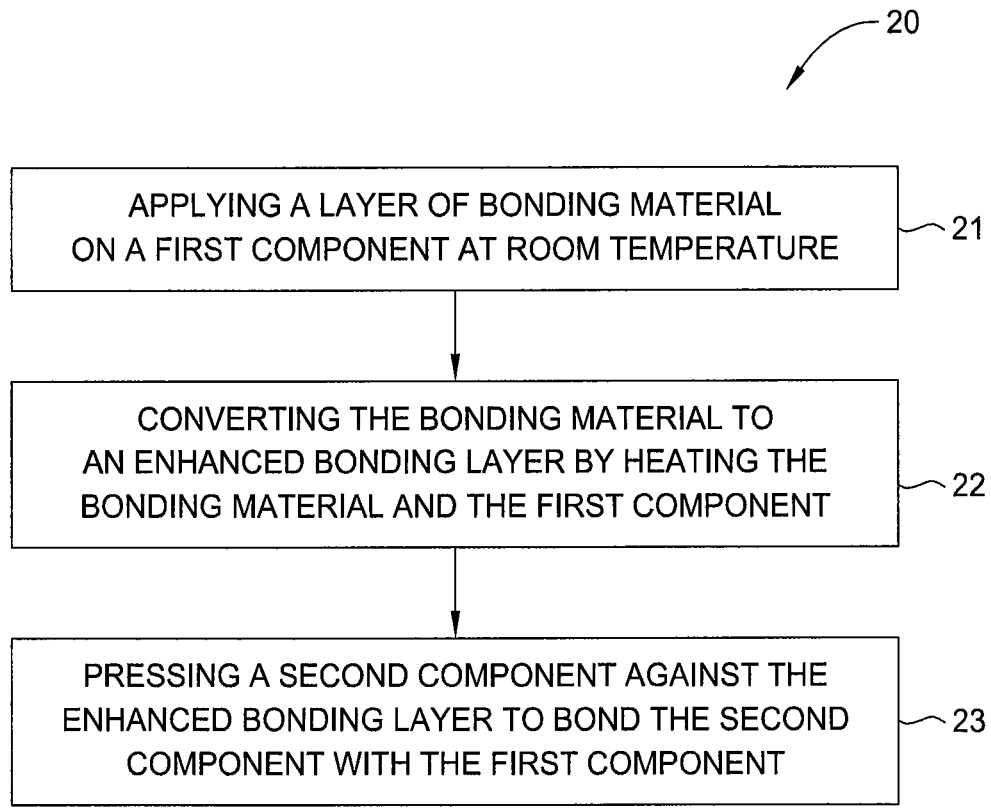
FIG. 1 is a flow diagram illustrating a method for forming a composite structure with enhanced thermal properties according to one embodiment of the present invention.

FIG. 1 is a flow diagram illustrating a method 20 according to one embodiment of the present invention for forming any composite structures using a bonding material. The method 20 provides a process for joining two or more components by a bonding layer with improved thermal stability. More particularly, the method 20 provides a baking process to obtain a bonding layer with improved thermal stability of a bonding material.

At box 21 of method 20, a layer of bonding material is applied to a first component, which is to be joined with a second component. The layer of bonding material is applied to a contact surface of the first component. The bonding material may be applied to the first component by any suitable means. In one embodiment, the layer of bonding material may be applied to the first component by disposing an adhesive sheet on the first component. In one embodiment, the adhesive sheet may be patterned to accommodate the designs of the first and second components. In one embodiment, the layer of bonding material may be applied to the first component at the room temperature.

The bonding material may be any suitable adhesive bonding materials depending on the materials and/or intended functions of the components to be bonded. For example, the bonding material may be thermoplastic acrylic based polymer or thermosetting silicone based polymer.

In one embodiment, one or more doping materials may be added to the bonding material to obtain desired properties, for example thermal conductivity and/or electrical conductivity. The doping material added to the bonding material may be in the form of powders. In one embodiment, the bonding material may include doping materials in nano or micro sized particles. For example, doping material may be powders having particle sizes between about 10 nm to about 20 um. In one embodiment, the doping material may be metal oxide powders, such as $Al_2O_3$ powder. In another embodiment, the doping material may be non-oxide powders, such as $TiB_2$ powder. In one embodiment, the bonding material may include a doping material at up to about 50% in volume.

The first and second components to be joined together may be made of same or different materials. For example, the first and second components may be both made of metal, both made of ceramic, or one of metal and one of ceramic. When the joined structure is intended to endure temperature changes during operation, for example, being heated and/or cooled, it is desirable to have the first and second components made of materials with similar coefficients of thermal expansion.

At box 22, the bonding layer is converted to an enhanced bonding layer is heating the bonding material applied on the first component. Since the second component is not yet attached to the bonding material, an entire surface of the bonding material is exposed to the environment during the baking process. The baking process may be performed by exposing the bonding material to a heat source for a period of time.

The baking process removes volatile species from the original bonding material and results in an enhanced bonding layer with improved thermal stability. In one embodiment, the baking process removes at least about 0.05% in mass of the bonding material in the form of volatile species. In one embodiment, as much as about 1.5% volatile species may be removed from the original bonding material as a result of the baking process. The enhanced bonding layer is different from the original bonding material in composition, physical properties and chemical properties. Experiments have shown that the enhanced bonding layer and the original bonding material have at least different molecular weights, different molecular weight distributions, different coefficients of thermal expansion, different polymer chain structures, and different tensile strengths. Particularly, the enhanced bonding layer has improved thermal stability compared to the original bonding material. In one embodiment, the enhanced bonding layer has a molecular weight which is reduced by at least about 35% from the molecular weight of the original bonding material as a result of the baking process. For polymer based bonding materials, about 30% of the polymer chains in the original bonding materials may be broken as a result of the baking process to obtain the enhanced bonding layer. The baking process also decreases coefficient of thermal extension of the bond material by about 6% to about 35%, Factors of the baking process, for example temperature, duration, environment, may be set to obtain the enhanced bonding layer depending on the properties of the original bonding material and the intended working environment.

In one embodiment, the temperature for the baking process is higher than the intended operating temperature. For example, the baking process may be performed at a temperature between about 60 degrees Celsius to about 250 degrees Celsius.

The duration of the baking process may be between about 1 hour to about 180 hours. In one embodiment, the end point of the baking process may be determined by monitoring outgassing rates of the volatile species from the bonding material. For example, the baking process may be terminated when the amount of certain species among the escaped volatile species fall below a predetermined level. The end point of the baking process may also be determined by the amount of volatile species outgassed from the bonding material. For example, the end point of the baking process is reached when the outgassed volatile species accumulate to at least about 0.05% in mass of the bonding material.

The baking process may be performed in any suitable environment. In one embodiment, the baking process may be performed in a controlled environment, for example in a vacuum environment. Alternatively, the baking process may be performed in an inert environment, for example at an environment filled with one or more inert gas. In another embodiment, the baking process may be performed in air at atmosphere pressure.

At box 23, the second component is joined to the first component via the enhanced bonding layer by pressing the second component against the enhanced bonding layer. The pressure applied to the first and second components may be between about 14 psi (1 atmospheric pressure) to about 200 psi. After the baking process, the enhanced bonding layer is usually cooled down to a joining temperature at which the first and second components are pressed and joined together. The joining temperature may be between about 25 degrees Celsius to about 200 degrees Celsius. In one embodiment, the pressing process may be performed at about 100 degrees Celsius.

The method 20 may be used to manufacture chamber parts joined by bonding material to improve the thermal stability of the chamber parts. For example, the method 20 may be used to join a puck of a substrate chuck, such as an electrostatic chuck (ESC), to a pedestal or a base. The method 20 may also be used to join different components of a showerhead.

ESCs often incorporate heating and/or cooling means to maintain the substrates at desirable temperatures in addition to securely supporting substrates during processing. While it is desirable to obtain temperature uniformity within a substrate and from substrates to substrate, traditional ESCs usually demonstrate temperature non-uniformity and temperature shift.

A traditional ESC usually includes a dielectric puck bonded to a metallic base by a bonding material. However, the bonding materials can have negative impact on processing, especially when the processes are performed at elevated temperatures. For example, volatile species in the bonding material joining the puck and the base may accumulate at the interface and form voids which affect uniformity of thermal conductivity between the puck and the base. As a result, temperatures of the ESC and the substrates supported on the ESC become non-uniform within the substrates or among substrates. Non-uniform temperature is undesirable because it generally results in non-uniform processing. Embodiments of the present invention improve thermal properties of chamber parts with bonding materials, such as ESCs, by baking the bonding material before bonding two or more components together, which substantially reduces after bonding out gassing which is a major contributor to temperature non-uniformity.

Figure 2A:
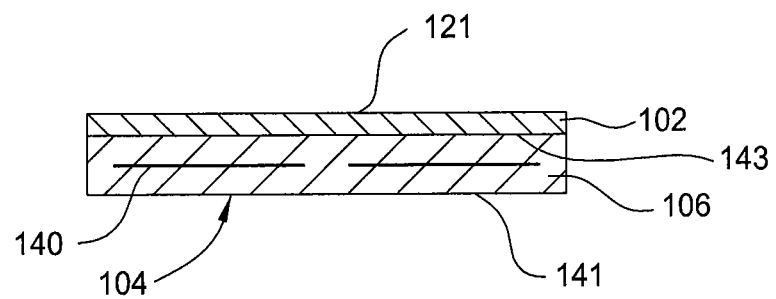
FIGS. 2A-2C are schematic sectional views showing formation of an electrostatic chuck according to one embodiment of the present invention.
Figure 2B:
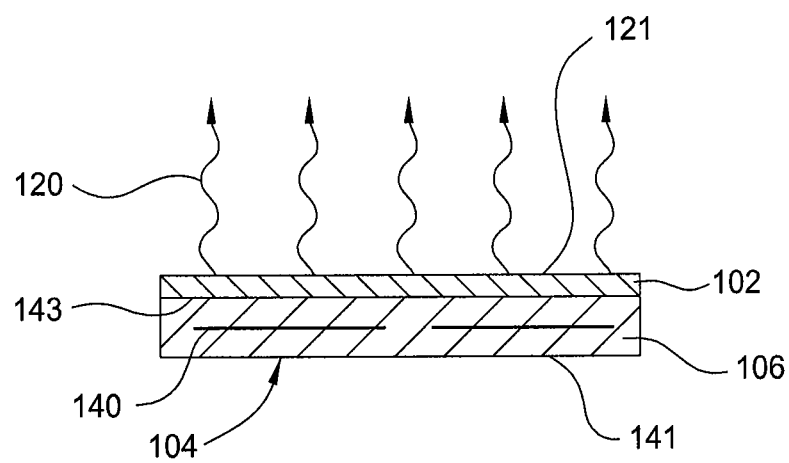
Figure 2C:
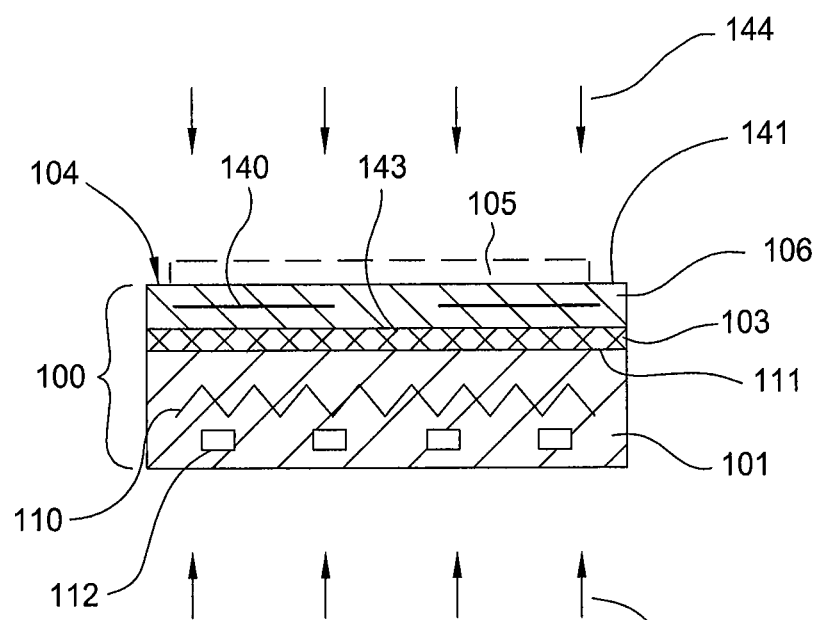

FIGS. 2A-2C are schematic sectional views showing formation of an electrostatic chuck 100 according to one embodiment of the present invention.

In FIG. 2A, a layer of bonding material 102 is applied to a bonding surface 143 of a chuck member 104. The chuck member 104 may be an electrostatic chuck. The layer of bonding material 102 is configured to bond the chuck member 104 to a base member 101 onto the bonding surface 143, as shown in FIG. 2C.

The chuck member 104 is used to support and secure a substrate 105 in a processing chamber. The chuck member 104 generally includes a body 106 fabricated from a dielectric material and an electrode 140 embedded in the body 106. In one embodiment, the body 106 has a substantially disk shape with a contact surface 141 for supporting a substrate 105 and the bonding surface 143 for bonding to the base member 101 via the bonding material 102.

The electrode 140 is capable of receiving an electrical charge to generate an electrostatic force to hold the substrate 105 against the contact surface 141 of the chuck member 104. In one embodiment, the electrode 140 is a monopolar electrode. Alternatively, the electrode 140 may be bipolar electrodes. The electrode 140 may be made of a mesh, a sheet, or a plate of suitable metal, such as aluminum, copper, chromium, molybdenum, tungsten, or combinations thereof.

The body 106 is formed from a dielectric material shaped and sized to provide desired electrical characteristics for chucking the substrate 105. Dielectric materials for the body 106 have good erosion resistance against processing chemistry in the processing chamber. The body 106 may be made from any suitable dielectric materials, for example ceramic materials, such as aluminum nitride or aluminum oxide.

The base member 101 is configured to proved physical support to the chuck member 104. In one embodiment, the base member 101 is also configured to provide temperature control to regulate the temperature of the chuck member 104 by thermal exchange with the chuck member 104. The base member 101 may be formed from thermal conductive materials, such as metal. For example, the base member 101 may be formed from aluminum or stainless steel. The base member 101 may be machined as a single piece or multiple pieces. The base member 101 may include one or more heat exchangers. For example, in one embodiment, the base member 101 may include an embedded heating element 110 configured to provide thermal energy to the base member 101. Alternatively, the base member 101 further includes fluid channels 112 for providing heat exchange by circulating cooling fluid or heating fluid through the fluid channels 112. In another embodiment, the base member 101 may include both the embedded heating element 110 and the fluid channels 112.

The bonding surface 143 of the chuck member 104 is configured to match an upper surface 111 of the base member 101. The bonding surface 143, the upper surface 111 and any bonding material disposed therein between serve as interface for heat exchange between the chuck member 104 and the base member 101. In one embodiment, the bonding surface 143 may be a planar circular surface. The bonding surface 143 may have a diameter between about 0.5 inch to above 17 inch, or depending on the size of the substrate to be secured to the chuck member 104.

The bonding material 102 applied to the chuck member 104 can be any suitable adhesive bonding materials, for example thermoplastic acrylic based polymer or thermosetting silicone based polymer. In one embodiment, prior to baking, the bonding material 102 may be an adhesive sheet before applying to the chuck member 104. In another embodiment, the bonding material 102 may be a patterned adhesive sheet to accommodating the specific designs of the ESC 100, for example holes for lifting pins.

In one embodiment, the bonding material 102 may be an adhesive sheet formed from a silicone based polymer having a thickness of about 0.25 mm, with a thermal conductivity of about 0.5 W/mk, Young's modulus of about 188 psi, Lap shear strength of about 200 psi, Lap shear strain of about 4, Poisson ratio of about 0.49, thermal expansion of about 0.22E-04/C, and density of about 2000 kg/m$^3$.

An enhanced bonding layer 103 is formed by exposing the bonding material 102 to an elevated temperature, or by baking the bonding material 102. As shown in FIG. 1B, after the bonding material 102 is applied to the chuck member 104, an upper surface 121 of the bonding material 102 is exposed to the environment while the bonding material 102 along with the chuck member 104 is exposed to a heat source. Various volatile species 120 escape from the upper surface 121 of the bonding material 102 during the baking process. By the end of the baking process, the enhanced bonding layer 103 is obtained. The enhanced bonding layer 103 is different from the bonding material 102 in composition, physical properties and chemical properties. Particularly, the enhanced bonding layer 103 has improved thermal stability compared to the bonding material 102. For example, the enhanced bonding layer 103 converted from the silicone based polymer described above may have a Lap shear strength of about 232 psi and Lap shear strain of about 5.6.

In one embodiment, factors of the baking process, for example temperature, duration, environment, may be set to obtain the enhanced bonding layer 103 depending on the properties of the bonding material 102 and the intended environment of the ESC 100. In one embodiment, the temperature for the baking process is higher than the intended operating temperature of the ESC 100. For example, the baking process may be performed at a temperature between about 60 degrees Celsius to about 250 degrees Celsius.

The duration of the baking process may be between about 1 hour to about 180 hours. In one embodiment, the end point of the baking process may be determined by monitoring outgassing rates of one or more species among the volatile species 120. For example, the baking process may be terminated when the amount of certain species within the volatile species 120 become fall below a predetermined level.

The baking process may be performed in any suitable environment. In one embodiment, the baking process may be performed in a controlled environment, for example, in a vacuum environment. Alternatively, the baking process may be performed in an inert environment, for example at an environment filled with one or more inert gas. In another embodiment, the baking process may be performed in air at atmosphere pressure.

In one embodiment, the bonding material 102 may be doped with a doping material prior to the baking process to obtain desired properties, for example, metal or metal based powders may be doped in the bonding material 102. The doping material is added to increase the conductivity of the bonding material 102 and the enhanced bonding layer 103. In one embodiment, the bonding material 102 may include doping materials in the form of nano or micro particles. For example, doping material may be powders having particle sizes between about 10 nm to about 20 um. In one embodiment, the doping material may be metal oxide powders, such as $Al_2O_3$ powder. In another embodiment, the doping material may be non-oxide powders, such as $TiB_2$ powder. In one embodiment, the bonding material 102 may include a doping material at up to about 50% in volume.

Referring to FIG. 1C, after the bonding material 102 has been baked and the enhanced bonding layer 103 is obtained, the chuck member 104 can be joined with the base member 101 by contacting the upper surface 121 of the enhanced bonding layer 103 and an upper surface 111 of the base member 101. In one embodiment, a pressure 144 may be applied between the chuck member 104 and the base member 101 to join the base member 101 and the chuck member 104. In one embodiment, the pressure may be between about 14 psi (1 atmospheric pressure) to about 200 psi.

As discussed above, the baking process according to embodiments of the present invention changes composition and properties of the original bonding material and obtains an enhanced bonding layer which provides improved thermal stability to the joined structure.

Figure 3:
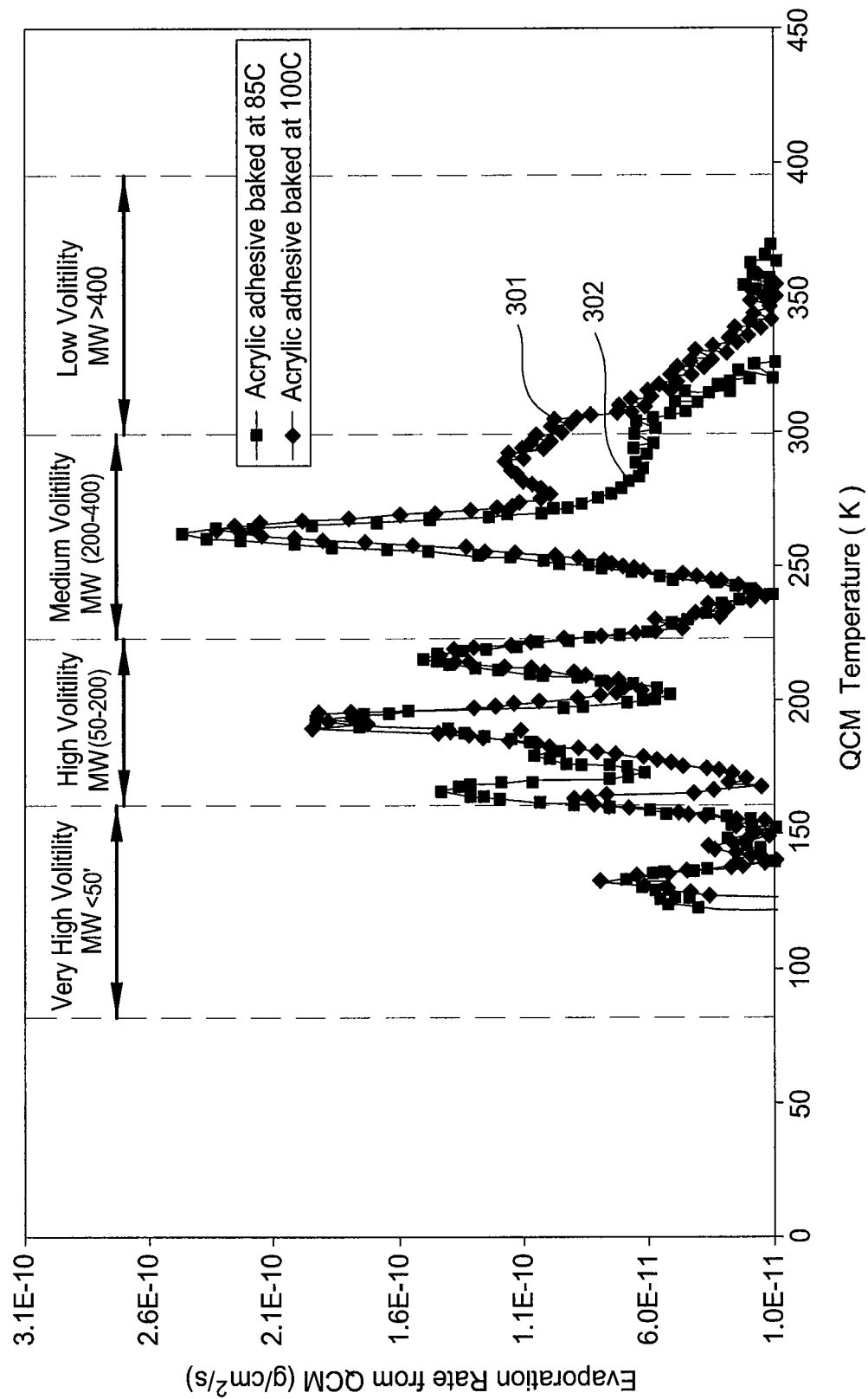
FIG. 3 illustrates schematic plots of evaporation rates of a bonding material during a baking process according to one embodiment of the present invention.

FIG. 3 illustrates schematic plots of evaporation rates of an exemplary bonding material measured by quartz crystal microbalance (QMC) during a baking process according to one embodiment of the present invention. The X-axis of FIG. 3 indicates the QMC temperature in Kevin, which relates to molecular weights of species being measured. The Y-axis of FIG. 3 indicates the evaporation rate of species from the bonding material during baking measured by QMC. The bonding material in the examples shown in FIG. 3 is a thermoplastic acrylic based polymer. Particularly, the original bonding material in the examples of FIG. 3 is THERMATTACH® T412 at thickness of 0.01 inch manufactured by Parker Seals. Curves 301 and 302 correspond to evaporation rates of various species during baking at temperatures of 100 degrees Celsius and 85 degrees Celsius.

FIG. 3 illustrates that species of various molecular weights evaporate from the original bonding material during the baking process according to embodiments of the present invention. Therefore, the molecular composition and distribution of the original bonding material has been changed during the baking process according to embodiments of the present invention.

FIG. 3 also demonstrates that the ratio of species escaped from the original bonding material may be adjusted by changing the baking temperature. The evaporated species have a larger average molecular weight when baked at a higher temperature than baked at a lower temperature.

Table 1 provides a list of typically volatile species escaped from a thermoplastic acrylic based polymer bonding material during a baking process at 100 degrees Celsius. As shown in Table 1, the volatile species escaped from the original bonding material during baking process include at least hydrocarbons, 1-hexanol, 2-ethyl-1-pentanol, benzoic acid, 2-prepenoic acid, 6-methylheptyle ester, phenol, 2,6-bis(1,1-dimethylethyle)-4-ethyl-phenol, and butyl hexadecanoate.

Table 2 provides molecular weight and molecular weight distribution of acrylic based bonding material before and after baking process according to embodiments of the present invention. In Table 2, Mn indicates number average molecular weight, Mw indicates weight average molecular weight, Mz indicates size average molecular weight, and MWD indicates molecular weight distribution. As shown in Table 2, after baking at 130° C. for 12 hours, the molecular weight of the acrylic based material has decreased, and the molecular weight distribution become smaller. After baking at 130° C. for 12 hours, the molecular weight decreased even further and the molecular weight distribution also continued to decrease. Additionally, Gel Permeation Chromatograph (GPC) tests also prove that the polymer chain length and/or cross linking of the acrylic based polymer bonding material is modified by the baking process according to embodiments of the present invention. For example, at least 30% of polymer chains are broken during the baking process.

TABLE 1

| Outgassing Compounds | Concentration (μg/g) |
|---|---|
| Water | Moderate* |
| Hydrocarbons | 13 |
|  | 4.2 |
|  | 2.5 |
|  | 2.8 |
|  | 2.5 |
|  | 6.4 |
|  | 3.3 |
| 1-Hexanol, 2-ethyl- ($C_6H_{14}O$) (MW = 102) | 44 |

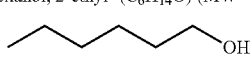

TABLE 1-continued

| Outgassing Compounds<br>Water | Concentration (μg/g)<br>Moderate* |
|---|---|
| Benzoic Acid ($C_6H_5COOH$) (MW = 122) | 9.7 |
| 2-Propenoic acid, 6-methylheptyl ester ($CH_2$=$CHCOOH$) (MW = 72) | 2.5 |
| Phenol, 2,6-bis(1,1-dimethylethyl)-4-ethyl- ($C_6H_6O$) (MW = 90) | 9.4 |
| Unknown (Butyl hexadecanoate) ($C_{20}H_{20}O_2$) (MW = 292) | 7.3 |

*From outgassing test.
**Water and the unidentified species were still present in the outgassing flux at the end of the 24-hour test

TABLE 2

|  | Mn | Mw | Mz | MWD |
|---|---|---|---|---|
| original acrylic based bonding material | 32020 | 257345 | 1227134 | 8.0 |
| after baking for 12 hours at 130° C. | 28916 | 154963 | 592831 | 5.4 |
| after baking for 24 hours at 130° C. | 26387 | 111577 | 267678 | 4.2 |

Table 3 provides changes in coefficient of thermal expansion (CTE) of the acrylic based bonding material before and after baking process according to embodiments of the present invention. In Table 3, Tg indicates glass transition temperature, and CTE indicates coefficient of thermal expansion. As shown in Table 3, CTE above glass transition temperature has an obvious decrease after baking at 130° C. for 12 hours and 24 hours. The differences in CTE indicate differences in amorphous material structure. Therefore, baking the acrylic based polymer bonding material has broken the polymer chain and changed the acrylic material structure, thus, produced a modified bonding material.

TABLE 3

|  | $T_g$ (° C.) | CTE (1/K)<br>(−55 − −30° C.) | CTE (1/K)<br>(−25 − −5° C.) |
|---|---|---|---|
| Original Acrylic based bonding material | −28.22 | 86.73 × $10^{-6}$ | 249.81 × $10^{-6}$ |
| After baking for 12 hours at 130° C. | −26.06 | 80.43 × $10^{-6}$ | 217.09 × $10^{-6}$ |
| After baking for 24 hours at 130° C. | −28.69 | 71.69 × $10^{-6}$ | 171.21 × $10^{-6}$ |

The enhanced or modified bonding material according to embodiments of the present invention have improved qualities, such as improved thermal stability, reduced contamination, and increased tensile strength, which are desirable for semiconductor processing.

Figure 4:
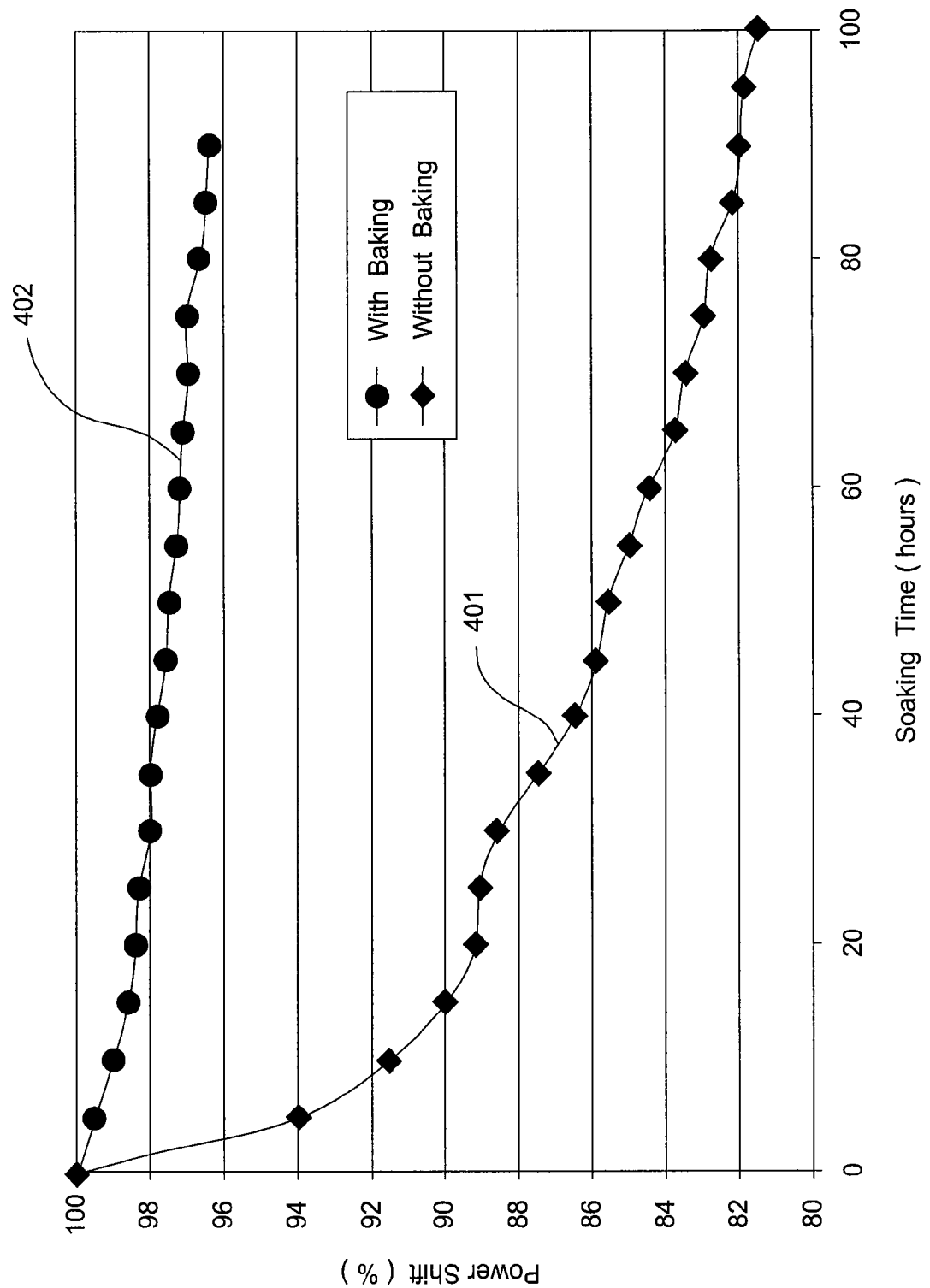
FIG. 4 illustrates schematic plots showing comparison of power shifts between a traditional ESC and ESC according to embodiments of the present invention.

FIG. 4 illustrates schematic plots showing comparison of power shifts between a traditional ESC and ESC according to embodiments of the present invention. Curve 401 illustrates the power shift with time during operation of a traditional ESC including an acrylic based polymer bonding material without baking. Curve 402 illustrates the power shift with time during operation of an ESC including a modified acrylic based polymer bonding material, which was baked for 24 hours at 120° C. prior to joining a chuck member and a base member. As shown in FIG. 4, the ESC of the present invention has much smaller power shift overtime than the traditional ESC. Therefore, the modified acrylic based polymer bonding material is proven to have improved stability in thermal conductivity than the original bonding material. Not to wish to be bond by any theories, inventors believe that the improved stability of thermal conductivity may be a result of the removal of volatile species from the original bonding material. During heating, the volatile species in a bonding material may migrate to the interfaces of the bonding material and the components being bonded, diffuse into the components, and form a layer of material that deters thermal exchange. As a result, traditional ESCs may lose thermal conductivity between the chuck member and the base member. By baking the bonding material before joining the components, embodiments of the present invention provide solution to improve stability of the thermal conductivity.

Figure 5:
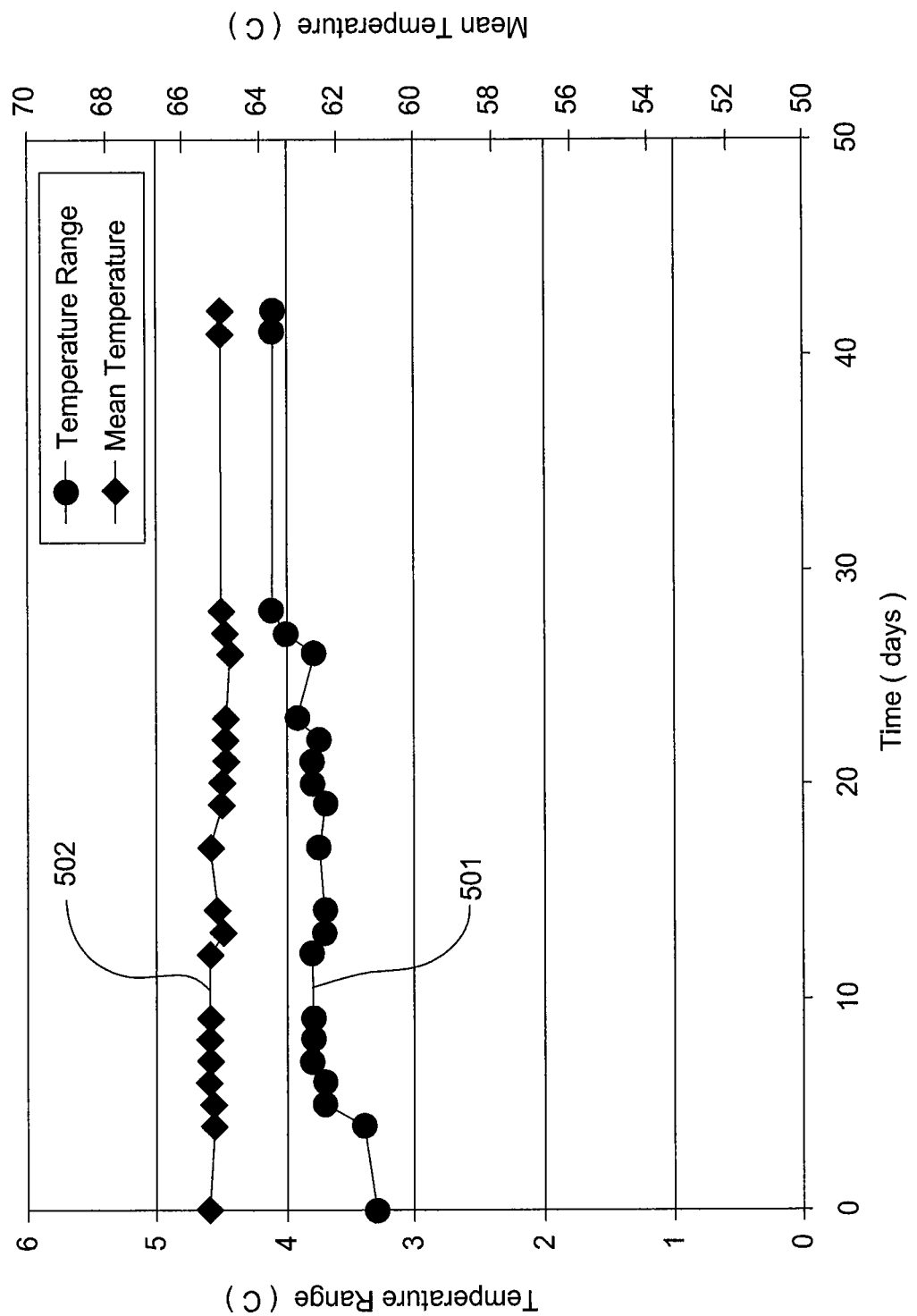
FIG. 5 illustrates schematic plots of temperature stability of an ESC according to embodiments of the present invention.

FIG. 5 illustrates schematic plots of temperature stability of an ESC according to embodiments of the present invention in a 50 day testing. Curve 501 shows that the temperature variation is close to 4 degrees Celsius within the 50 days. Curve 502 shows that the mean temperature is stable.

Figure 6:
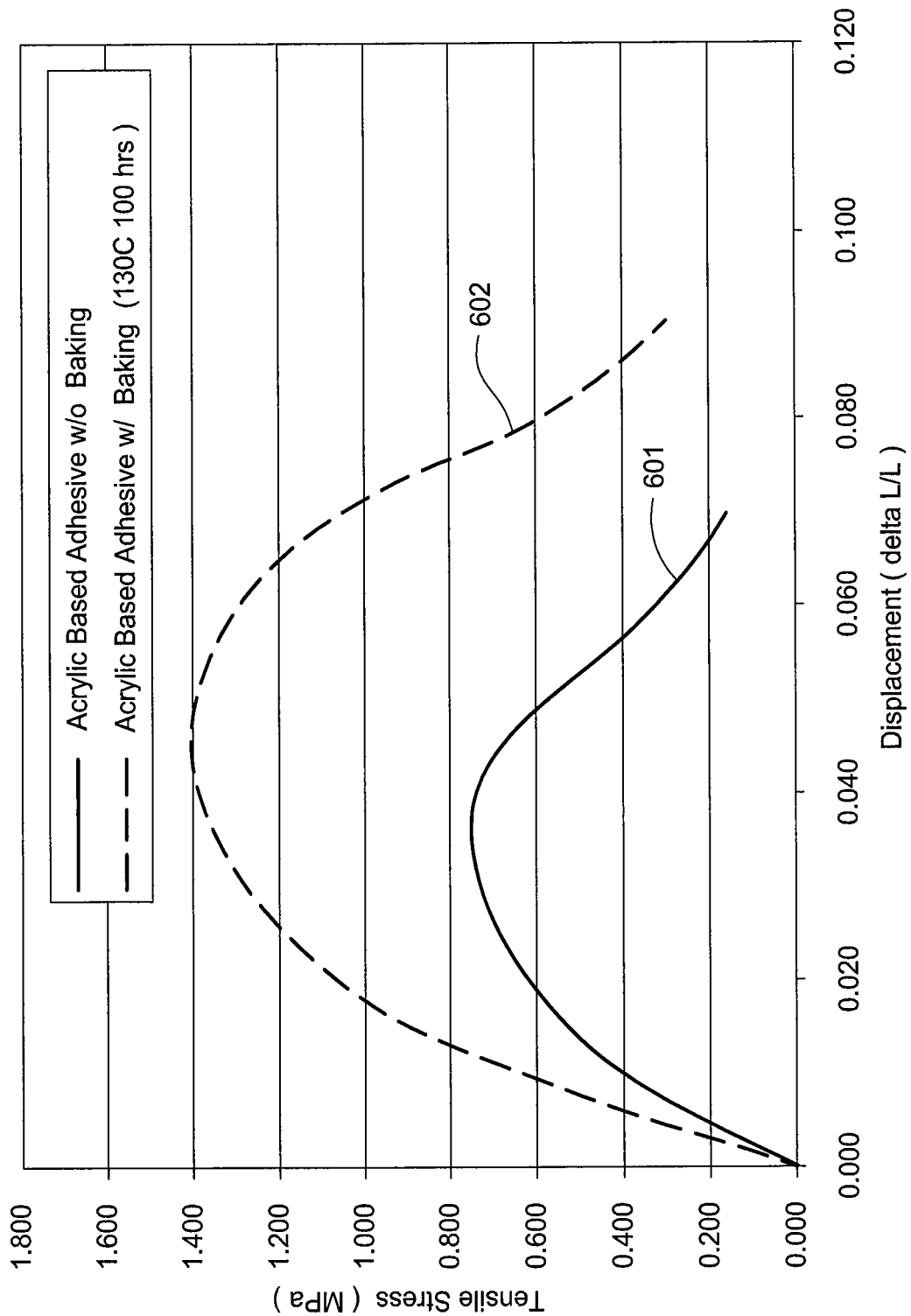
FIG. 6 illustrates schematic plates showing comparison of tensile strength between a traditional bonding material and an enhanced bonding material according to embodiments of the present invention.

FIG. 6 illustrates schematic plates showing comparison of tensile strength between a traditional bonding material and an enhanced bonding material according to embodiments of the present invention. Curve 601 is a stress-strain curve of an original acrylic based polymer bonding material without baking. Curve 602 is a stress-strain curve of the modified acrylic based polymer bonding material, which was obtained by baking the original acrylic based polymer bonding material for 100 hours at 130° C. The modified acrylic based polymer bonding material has more advance stress-strain performance than the original acrylic based bonding material. The improved stress-strain performance makes the modified acrylic based bonding material better suited for bonding components with mismatched coefficients of thermal expansion. Therefore, the modified acrylic based bonding material can be used in bonding a larger variety of materials together.

Other bonding materials, such as thermosetting silicone based polymer bonding material, also demonstrate the similar changes to their physical properties and improved properties from a baking process according to embodiments of the present invention.

Embodiments of the present invention may also be used in forming showerheads for semiconductor processing. For example, showerheads for distributing processing gases to a plasma processing chamber may include a conductive plate bonded to a ceramic plate using a bonding material. The bonding materials provide secured connection between different components while providing thermal conductivity and/or electrical insulation. When a showerhead joined by traditional bonding materials is heated, volatile species in the bonding materials may escape into the processing chamber. Because the substrate being processed usually has the lowest temperature in the processing chamber during processing, the escaped volatile species naturally condenses on the substrate with low temperature forming undesired deposition on the substrate. Embodiments of the present invention, such as the method 20, may be used to bond showerheads.

Figure 7A:
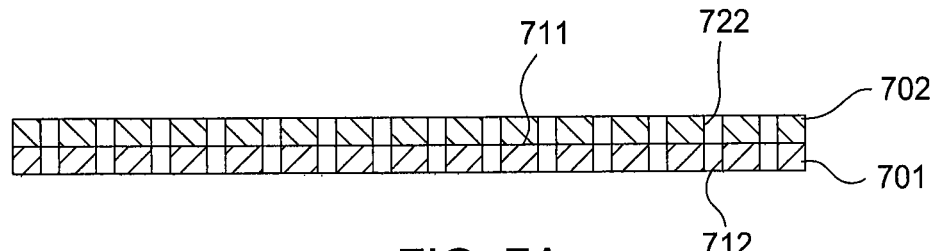
FIGS. 7A-7C are schematic sectional views showing formation of a showerhead according to one embodiment of the present invention.
Figure 7B:
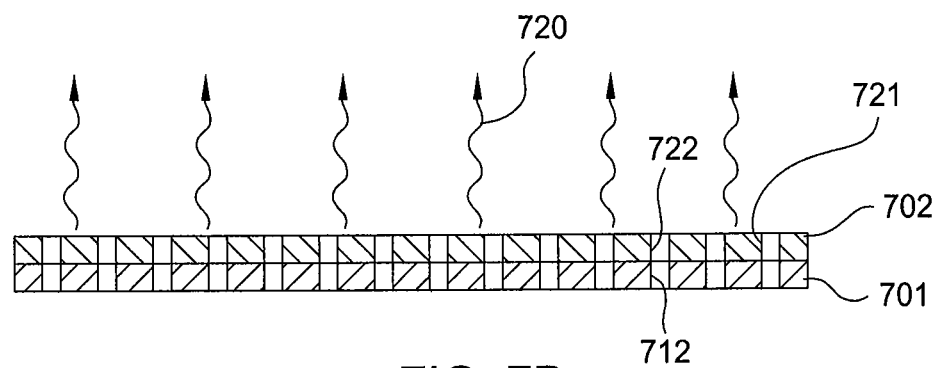
Figure 7C:
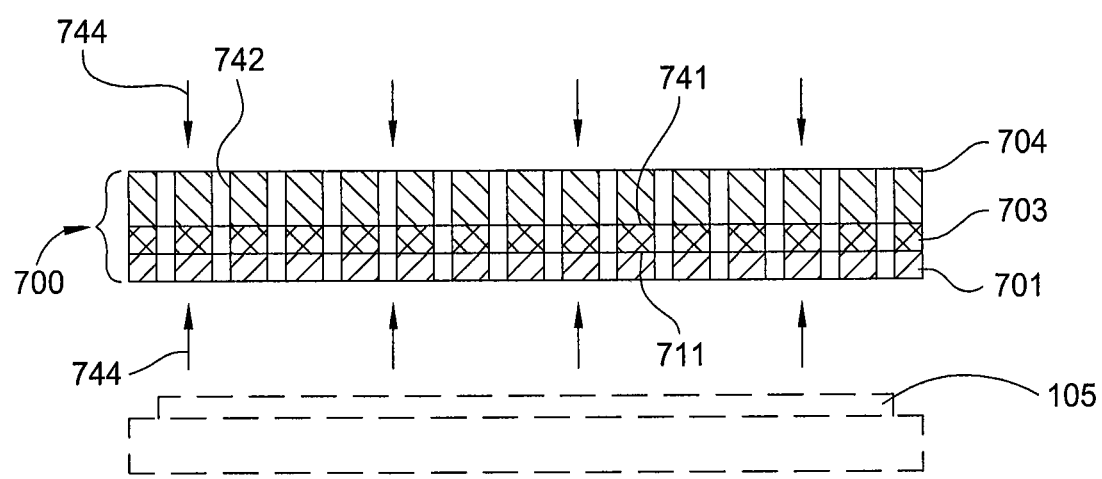

FIGS. 7A-7C are schematic sectional views of a sequence of forming a showerhead 700 according to one embodiment of the present invention.

As illustrated in FIG. 7A, a layer of bonding material 702 is applied to an upper surface 711 of a showerhead cover 701. The layer of bonding material 702 is configured to bond a showerhead body 704 to the showerhead cover 701 onto the upper surface 711 as shown in FIG. 7C.

The showerhead cover 701 is configured to face and be exposed to a processing environment of a vacuum processing chamber. The showerhead cover 701 may be made of any material compatible with the processing chemistry, and/or with suitable electric properties. The showerhead cover 701 may be formed from metals, oxides, nitrides, or ceramic materials. In one embodiment, the showerhead cover 701 is formed from a ceramic material, such as ceramic material based on SiC or $Y_2O_3$. The showerhead cover 701 may be a planar disk having a plurality of through holes 712 configured to allow passage of processing gas.

The bonding material 702 applied to the showerhead cover 701 can be any suitable adhesive bonding material, for example thermoplastic acrylic based polymer or thermosetting silicone based polymer. In one embodiment, the bonding material 702 may be an adhesive sheet before applying to the showerhead cover 701. The bonding material 102 may be a patterned adhesive sheet having a plurality of through holes 722 patterned to align with the through holes 712 of the showerhead cover 701.

The showerhead body 704 may be formed from metal or ceramic. In one embodiment, the showerhead body 704 is formed from aluminum. The showerhead body 704 may have a planar disk shaped body having a plurality of through hole 742 formed therein. The through holes 742 match the through holes 712 and 722 to provide passages for processing gas. The showerhead body 704 has a bonding surface 741 configured to be bonded to the showerhead cover 701 by the bonding material 702.

Referring to FIG. 7B, an enhanced bonding layer 703 is formed by exposing the bonding material 702 to an elevated temperature, or by baking the bonding material 702. As shown in FIG. 7B, after the bonding material 702 is applied to the showerhead cover 701, an upper surface 721 of the bonding material 702 is exposed to the environment while the bonding material 702 along with the showerhead cover 701 is subjected to an elevated temperature. Various volatile species 720 escape from the upper surface 721 of the bonding material 702 during the baking process. By the end of the baking process, the enhanced bonding layer 703 is obtained. Similar to the enhanced bonding layer 103, the enhanced bonding layer 703 also has modified physical properties and chemical properties. Particularly, the enhanced bonding layer 703 has improved thermal stability compared to the bonding material 702. The baking process may be performed as described by method 20.

Referring to FIG. 7C, after the bonding material 702 has been baked and the enhanced bonding layer 703 is obtained, the showerhead body 704 can be joined with the showerhead cover 701 by contacting the upper surface 721 of the enhanced bonding layer 703 and the bonding surface 741 of the showerhead body 704. In one embodiment, a pressure 744 may be applied between the showerhead body 704 and the showerhead cover 701 to join the two pieces together. In one embodiment, the pressure may be between about 14 psi (1 atmospheric pressure) to about 200 psi.

By baking the bonding material prior to joining two components together, embodiments of the present invention effectively prevent volatile species from the bonding material in the showerhead from condensing on the substrate being processed, thus, improving processing quality.

Even though a showerhead and an ESC are described above, embodiments of the present invention may applied to any chamber components, or composite structure joined by bonding materials to obtain improved thermal stability.

While the foregoing is directed to embodiments of the present invention, other and further embodiments of the invention may be devised without departing from the basic scope thereof, and the scope thereof is determined by the claims that follow.

What is claimed is:

1. A method for fabricating a composite structure, comprising:

applying a bonding material to a first component;

converting the bonding material applied to the first component to an enhanced bonding layer by:
  heating the bonding material to outgas volatile species from the bonding material, wherein the outgassed volatile species accumulate to at least 0.05% in mass of the bonding material; and
  monitoring at least one of a ratio of the outgassed volatile species of different molecular weights and evaporating rates of the outgassed volatile species,
  wherein the enhanced bonding layer has a molecular weight that is reduced by at least 35% from a molecular weight of the bonding material; and
contacting a second component and the enhanced bonding layer to join the first and second components, wherein contacting the second component and the enhanced bonding layer comprises pressing the first and second components against each other at a pressure between about 14 psi to about 200 psi.

2. The method of claim 1, wherein heating the bonding material comprises baking the bonding material and the first component at a baking temperature.

3. The method of claim 1, wherein the bonding material is an acrylic based or silicone based polymer bonding material.

4. The method of claim 3, wherein converting the bonding material further comprises reducing molecular weight and polymer chain length or cross linking.

5. The method of claim 2, wherein converting the bonding material comprises heating the bonding material and the first component in a vacuum environment.

6. The method of claim 5, wherein converting the bonding material further comprises determining an end point by monitoring the volatile species escaped from the bonding material.

7. The method of claim 2, wherein converting the bonding material further comprises heating the bonding material to a temperature higher than an intended operating temperature of the composite structure.

8. The method of claim 7, wherein heating the bonding material to a temperature higher than an intended operating temperature of the composite structure comprises heating the bonding material to a temperature between about 60° C. to about 260° C.

9. The method of claim 7, wherein heating the bonding material to a temperature higher than an intended operating temperature of the composite structure comprises heating the bonding material for about 1 hour to about 180 hours.

10. A method for forming a structure for a semiconductor processing chamber, comprising:
  applying a bonding material to a first component of the structure;
  converting the bonding material applied to the first component to an enhanced bonding layer by:
    baking the bonding material and the first component while the bonding material is exposed, wherein the enhanced bonding layer has at least 0.05% less volatile material than the bonding material, and the enhanced bonding layer has a molecular weight that is reduced by at least 35% from a molecular weight of the bonding material; and
  pressing a second component against the enhanced bonding layer to join the first and second components by applying a pressure between about 14 psi to about 200 psi.

11. The method of claim 10, wherein baking the bonding material is performed at a temperature between about 60° C. to about 260° C.

12. The method of claim 10, wherein the bonding material is an acrylic based or silicone based polymer bonding material.

13. The method of claim 12, wherein the enhanced bonding layer is different from the bonding material in molecular weight and polymer chain structure.

14. The method of claim 13, wherein the structure is an electrostatic chuck or a showerhead.

15. The method of claim 1, wherein converting the bonding material further comprises changing a heating temperature to adjust the ratio of outgassed species escaped from the bonding material.

16. The method of claim 15, further comprising increasing the heating temperature to increase an average molecular weight in the outgassed species.

17. The method of claim 15, further comprising reducing the heating temperature to reduce an average molecular weight in the outgassed species.

18. The method of claim 1, further comprising doping the bonding material with an oxide material at up to 50% in volume in the bonding material.

* * * * *